(12) United States Patent
Hatooka et al.

(10) Patent No.: US 7,282,965 B2
(45) Date of Patent: Oct. 16, 2007

(54) SIGNAL DETECTION CIRCUIT CAPABLE OF AUTOMATICALLY ADJUSTING THRESHOLD VALUE

(75) Inventors: Kazuya Hatooka, Hyogo (JP); Shoichi Yoshizaki, Kyoto (JP); Koki Imamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 3 days.

(21) Appl. No.: 11/238,147

(22) Filed: Sep. 29, 2005

(65) Prior Publication Data

US 2007/0069768 A1    Mar. 29, 2007

(51) Int. Cl.
*H03K 5/22* (2006.01)

(52) U.S. Cl. .............................. 327/80; 327/74; 327/81

(58) Field of Classification Search ............ 327/74–76, 327/50–52, 56, 77, 80, 81
See application file for complete search history.

(56) References Cited

U.S. PATENT DOCUMENTS

| | | | |
|---|---|---|---|
| 5,448,200 A * | 9/1995 | Fernandez et al. | 327/560 |
| 6,028,464 A * | 2/2000 | Bremner | 327/309 |
| 6,486,710 B1 * | 11/2002 | Simoni | 327/63 |
| 6,653,892 B2 * | 11/2003 | Park | 327/563 |
| 6,781,465 B1 * | 8/2004 | Berzins et al. | 330/258 |
| 6,907,202 B1 * | 6/2005 | Ide et al. | 398/208 |
| 6,977,529 B2 * | 12/2005 | Self | 327/3 |
| 7,061,280 B2 * | 6/2006 | Fiedler | 327/68 |
| 7,120,408 B2 * | 10/2006 | Wood | 455/218 |

FOREIGN PATENT DOCUMENTS

JP    2003-198392    7/2003

* cited by examiner

*Primary Examiner*—Kenneth B. Wells
*Assistant Examiner*—Hai L. Nguyen
(74) *Attorney, Agent, or Firm*—McDermott Will & Emery LLP (57) ABSTRACT

The signal detection circuit of the present invention includes: a comparison section for comparing the absolute value of a voltage of an input differential signal with a threshold voltage corresponding to a first detection level adjustment signal to detect presence/absence of an input signal and outputting a detection signal indicating the detection result; a threshold adjustment control section for generating the first detection level adjustment signal in response to the detection signal and outputting the generated signal; and a detection section for detecting whether or not the level of the detection signal changes repeatedly. During the time of no input of the differential signal, the threshold adjustment control section changes the first detection level adjustment signal so that the threshold voltage monotonically increases or decreases until the detection signal is inverted, to determine the first detection level adjustment signal that makes the threshold voltage appropriate, and outputs the determined signal.

10 Claims, 9 Drawing Sheets

SIGNAL DETECTION CIRCUIT CAPABLE OF AUTOMATICALLY ADJUSTING THRESHOLD VALUE

BACKGROUND OF THE INVENTION

The present invention relates to a device for receiving digital data, and more particularly, to a signal detection circuit for detecting presence/absence of a reception signal.

In serial communications, a signal detection circuit for detecting whether or not a prescribed signal is being input is often used. Such a signal detection circuit determines that an input signal is valid if the absolute value of the voltage of the input signal is equal to or more than a predetermined value and is not valid if the absolute value is less than the predetermined value. In Universal Serial Bus (USB) and Serial AT Attachment (serial ATA), the signal detection circuit is used for a return sequence from an initialize sequence and a power management state. In particular, in Serial ATA, the signal detection circuit is used for detecting an out-of-band (OOB) signal, in addition to detecting the signal state during communications.

The OOB signal is a signal having a fixed-length time period during which a burst signal is transmitted (burst time period) and a non-signal time period repeated alternately, and meaning is given to the lengths of the burst time period and the non-signal time period and the number of times of the repetition. Such an OOB signal is used during initialization and power management.

Figure 8:
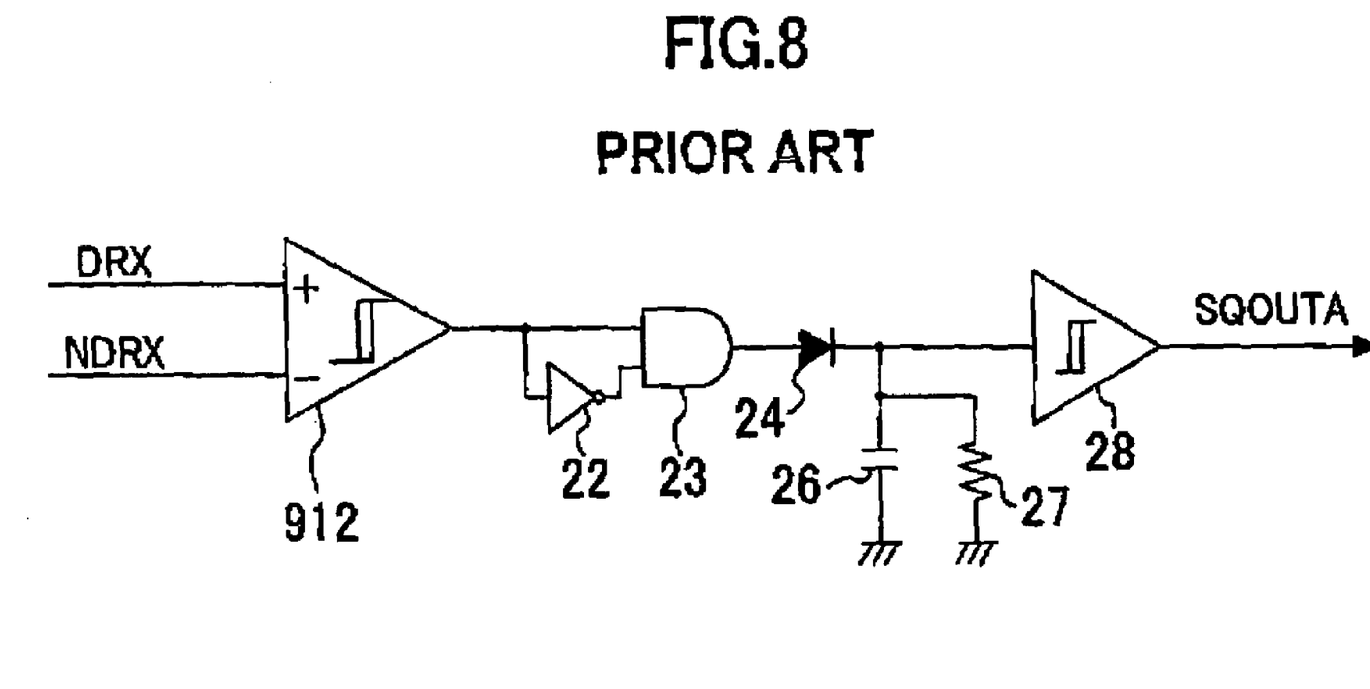
FIG. 8 is a circuit diagram of a conventional signal detection circuit.

FIG. 8 is a circuit diagram of a conventional signal detection circuit, which is one described in the Serial ATA standards. The signal detection circuit of FIG. 8 detects whether or not the voltage between input signals DRX and NDRX is equal to or more than a predetermined value, and outputs the detection result as a squelch signal SQOUTA.

Figure 3:
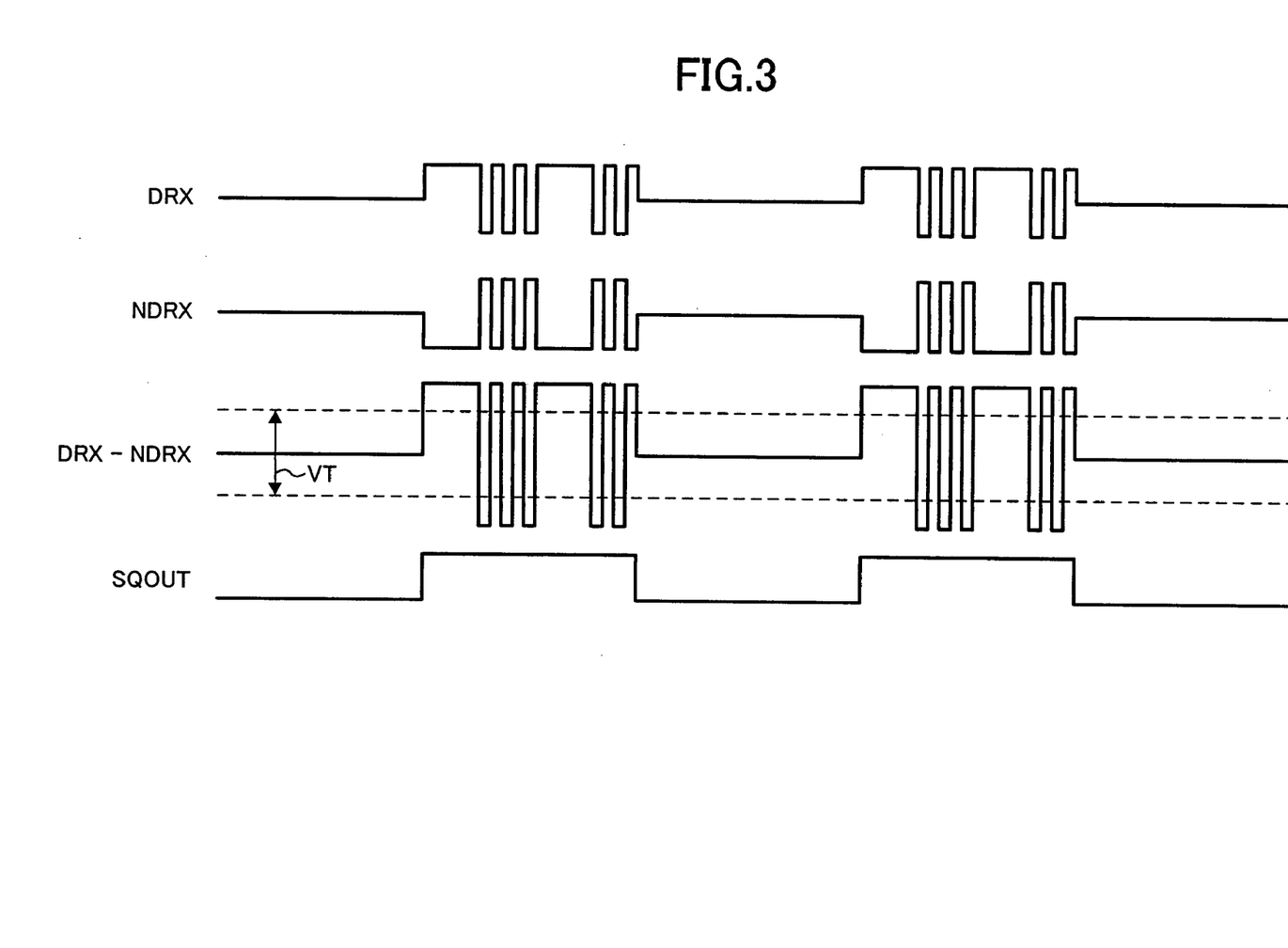
FIG. 3 is a timing chart of signals in the signal detection circuit of FIG. 1 in an ideal case.

FIG. 3 shows an example of the squelch signal obtainable in an ideal case. A squelch signal SQOUT in FIG. 3 goes high in correspondence with the burst time period and goes low during the non-signal time period.

A signal detection circuit that outputs a squelch signal required in USB 2.0 Standard is disclosed in Japanese Laid-Open Patent Publication No. 2003-198392, for example. This circuit has a merit that the input signal is less dependent on a common mode voltage and the allowable voltage range of the input signal is wide.

For a signal detection circuit required to receive a high-frequency signal and respond at high speed, like a signal detection circuit used in Serial ATA and the like, it is necessary to set the voltage used as the reference during detection (threshold value) appropriately considering the signal detection characteristics in high-frequency environments. If the threshold value is not appropriate, the detection result will be as described below.

Figure 9A:
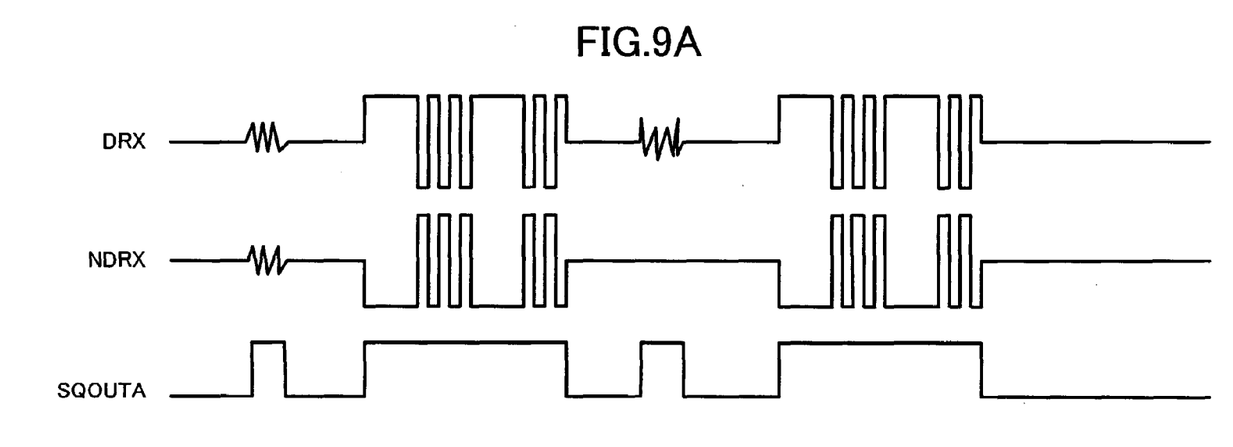
FIG. 9A is a graph showing a squelch signal generated when the input signals have noise and the threshold voltage is low.
Figure 9B:
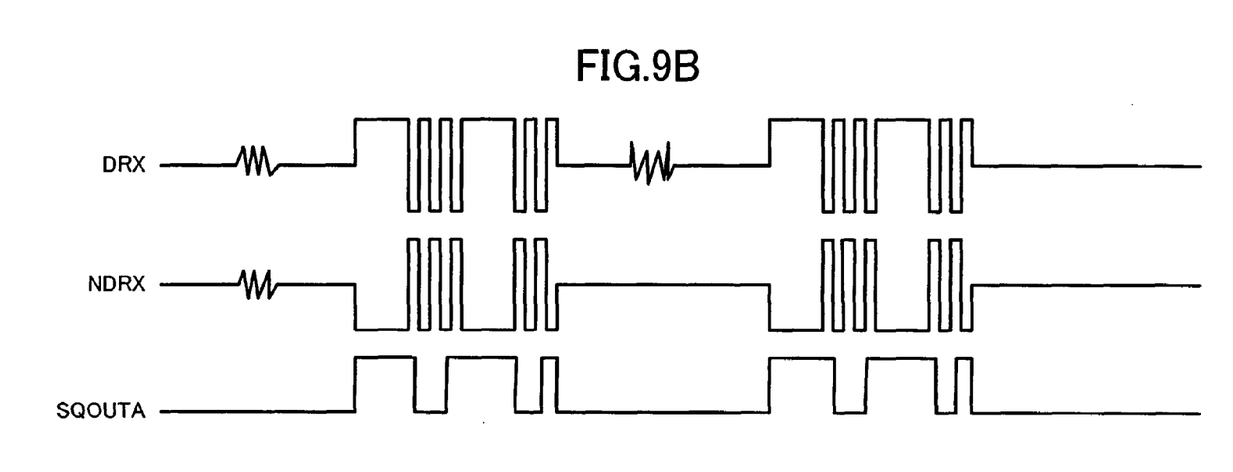
FIG. 9B is a graph showing a squelch signal generated when the input signals have noise and the threshold voltage is high.

FIG. 9A is a graph showing a squelch signal generated when the input signals have noise and the threshold value is low. FIG. 9B is a graph showing a squelch signal generated when the input signals have noise and the threshold voltage is high.

If the threshold value is set excessively low in the signal detection circuit of FIG. 8, noise in the input signals DRX and NDRX will be detected erroneously, resulting in output of the squelch signal SQOUTA as the detection result as shown in FIG. 9A. On the contrary, if the threshold voltage is set excessively high, high-frequency components of the input signals DRX and NDRX will fail to be detected, resulting in failure in detection of an input signal although the input signals DRX and NDRX are input, as shown in FIG. 9B.

As another problem, the signal detection circuit is provided with a comparator and transistors constituting the comparator vary in threshold value. Therefore, a given threshold value, if set for signal detection circuits, is not necessarily appropriate, and the detection result may vary among the signal detection circuits.

SUMMARY OF THE INVENTION

An object of the present invention is avoiding a variation in detection result among signal detection circuits.

According to the present invention, during the time of no input of a differential signal into the comparator, the threshold voltage of a comparator is increased or decreased until a detection signal from the comparator is inverted, to thereby make the threshold voltage appropriate.

To state more specifically, the signal detection circuit of the present invention includes: a comparison section for comparing the absolute value of a voltage of an input differential signal with a threshold voltage corresponding to a first detection level adjustment signal to detect presence/absence of an input signal and outputting a detection signal indicating the detection result; a threshold adjustment control section for generating the first detection level adjustment signal in response to the detection signal and outputting the generated signal; and a detection section for detecting whether or not the level of the detection signal changes repeatedly, wherein, during the time of no input of the differential signal, the threshold adjustment control section changes the first detection level adjustment signal so that the threshold voltage monotonically increases or decreases until the detection signal is inverted, to determine the first detection level adjustment signal that makes the threshold voltage appropriate, and outputs the determined signal.

The present invention suppresses a variation in detection result among signal detection circuits, and thus is useful for a signal detection circuit, such as a squelch circuit for detecting presence/absence of a reception signal, particularly in the case of handling a small-amplitude input signal and requiring high-speed response.

DETAILED DESCRIPTION OF THE INVENTION

Hereinafter, preferred embodiments of the present invention will be described with reference to the accompanying drawings.

First Embodiment

Figure 1:
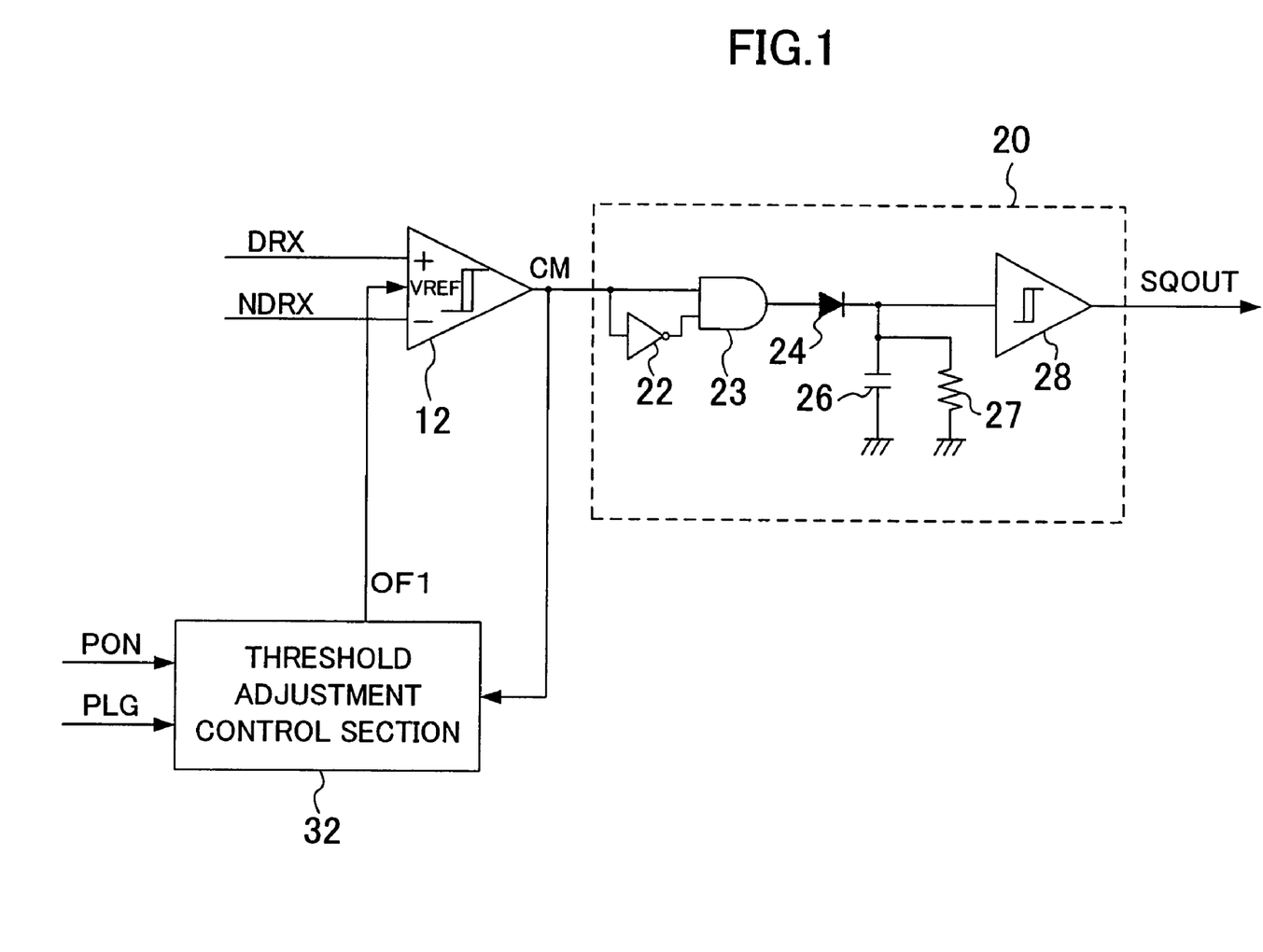
FIG. 1 is a block diagram of a signal detection circuit of the first embodiment of the present invention.

FIG. 1 is a block diagram of a signal detection circuit of the first embodiment of the present invention. The signal detection circuit of FIG. 1 includes a comparator 12 as the comparison section, a detection section 20 and a threshold adjustment control section 32. The detection section 20 includes an inverter 22, an AND gate 23, a diode 24, a capacitor 26, a resistance 27 and a buffer 28.

Two input signals DRX and NDRX constitute a differential signal. The input signal DRX is input into a positive input terminal + of the comparator 12, the input signal NDRX into a negative input terminal − thereof, and a detection level adjustment signal OF1 into a reference input terminal VREF thereof.

The comparator 12 sets its threshold voltage in response to the detection level adjustment signal OF1. Assume herein that the comparator 12 sets a higher threshold voltage as the potential of the detection level adjustment signal OF1 is higher.

The comparator 12, which exhibits hysteresis, compares the absolute value of the difference between the input signals DRX and NDRX with the threshold voltage to detect presence/absence of an input signal, and outputs the detection result to the inverter 22 and the AND gate 23 as a detection signal CM. Specifically, the comparator 12 outputs a high potential (hereinafter, referred to as "H") indicating that an input signal has been detected if |DRX−NDRX| is equal to or more than a threshold voltage set for the time of input voltage increase, while outputting a low potential (hereinafter, referred to as "L") indicating that no input signal has been detected if |DRX−NDRX| is less than a threshold voltage set for the time of input voltage decrease. In the following description, for simplification, the threshold voltage for the time of input voltage increase and the threshold voltage for the time of input voltage decrease are assumed identical to each other.

The detection section 20 detects whether or not the level of the detection signal CM changes repeatedly, and outputs the detection result as a squelch signal SQOUT. The inverter 22 of the detection section 20 inverts the detection signal CM and sends the inverted signal to the AND gate 23 with a slight delay. The AND gate 23 therefore outputs "H" to the diode 24 only at the instant immediately after a change of the detection signal CM from "L" to "H". The capacitor 26 accumulates charge when the output from the AND gate 23 is "H". Accordingly, the input level of the buffer 28 rises when the output level of the comparator 12 changes. The resistance 27 gradually releases the charge in the capacitor 26.

The buffer 28, which exhibits hysteresis, outputs "H" when the input signal becomes equal to or higher than a detection level for the time of input voltage increase, and outputs "L" if the input signal becomes lower than a detection level for the time of input signal decrease, externally as the squelch signal SQOUT.

The threshold adjustment control section 32 receives the detection signal CM output from the comparator 12, a power-on signal PON indicating that the signal detection circuit has just been powered on, and a hot plug signal PLG. The hot plug signal PLG indicates that a cable for transmitting the differential signal composed of the input signals DRX and NDRX has been connected. Specifically, lines for transmitting the differential signal and a line for transmitting the hot plug signal PLG constitute one cable, and once the lines for transmitting the differential signal are connected to the signal detection circuit of FIG. 1, the line for transmitting the hot plug signal PLG is also connected, to allow the threshold adjustment control section 32 to receive the hot plug signal PLG.

The input signals DRX and NDRX are not yet input at the time immediately after the input of the power-on signal PON and the hot plug signal PLG Therefore, the threshold adjustment control section 32 starts adjustment of the threshold voltage of the comparator 12 upon receiving the power-on signal PON or the hot plug signal PLG.

Figure 2:
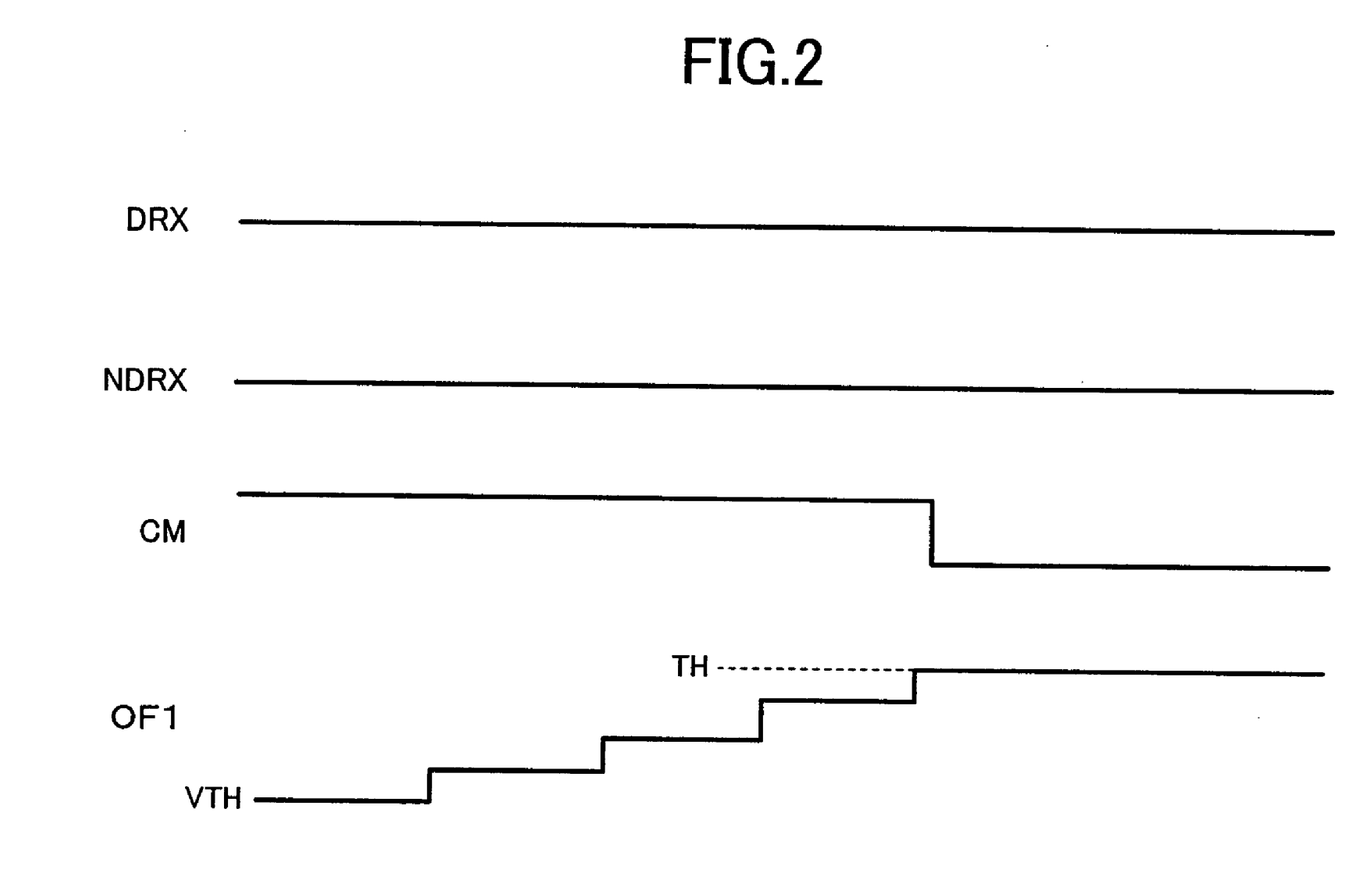
FIG. 2 is a timing chart showing an example of change of signals during adjustment of the threshold voltage of a comparator in the signal detection circuit of FIG. 1.

FIG. 2 is a timing chart showing an example of change of signals during the adjustment of the threshold voltage of the comparator 12. FIG. 2 shows a non-signal state in which the input signals DRX and NDRX are not input (the voltage between the input signals DRX and NDRX is roughly zero), during the time immediately after input of the power-on signal PON, for example. The threshold adjustment control section 32 first sets the potential of the detection level adjustment signal OF1 at a predetermined initial value VTH. If the initial value VTH is a value close to zero, the detection signal CM will go "H".

In the case that the detection signal CM is made "H" as described above, the threshold adjustment control section 32 then raises the potential of the detection level adjustment signal OF1 so as to increase the threshold voltage of the comparator 12. The threshold adjustment control section 32 may raise the potential of the detection level adjustment signal OF1 step by step as shown in FIG. 2, or may raise the signal in a smoother manner.

The detection signal CM goes "L" when the detection level adjustment signal OF1 reaches a potential TH. Determining that the potential TH is appropriate as the potential of the detection level adjustment signal OF1, the threshold adjustment control section 32 fixes the detection level adjustment signal OF1 at the potential TH.

FIG. 3 is a timing chart of signals in the signal detection circuit of FIG. 1 in an ideal case. When the amplitude of the differential signal is equal to or more than the threshold voltage VT, the detection signal CM goes "H" and thus the squelch signal SQOUT as shown in FIG. 3 is obtained.

By use of the thus-obtained detection level adjustment signal OF1, erroneous detection of noise and failure in detection of high-frequency components can be avoided, and thus a correct squelch signal SQOUT can be obtained.

(First Alteration)

Figure 4:
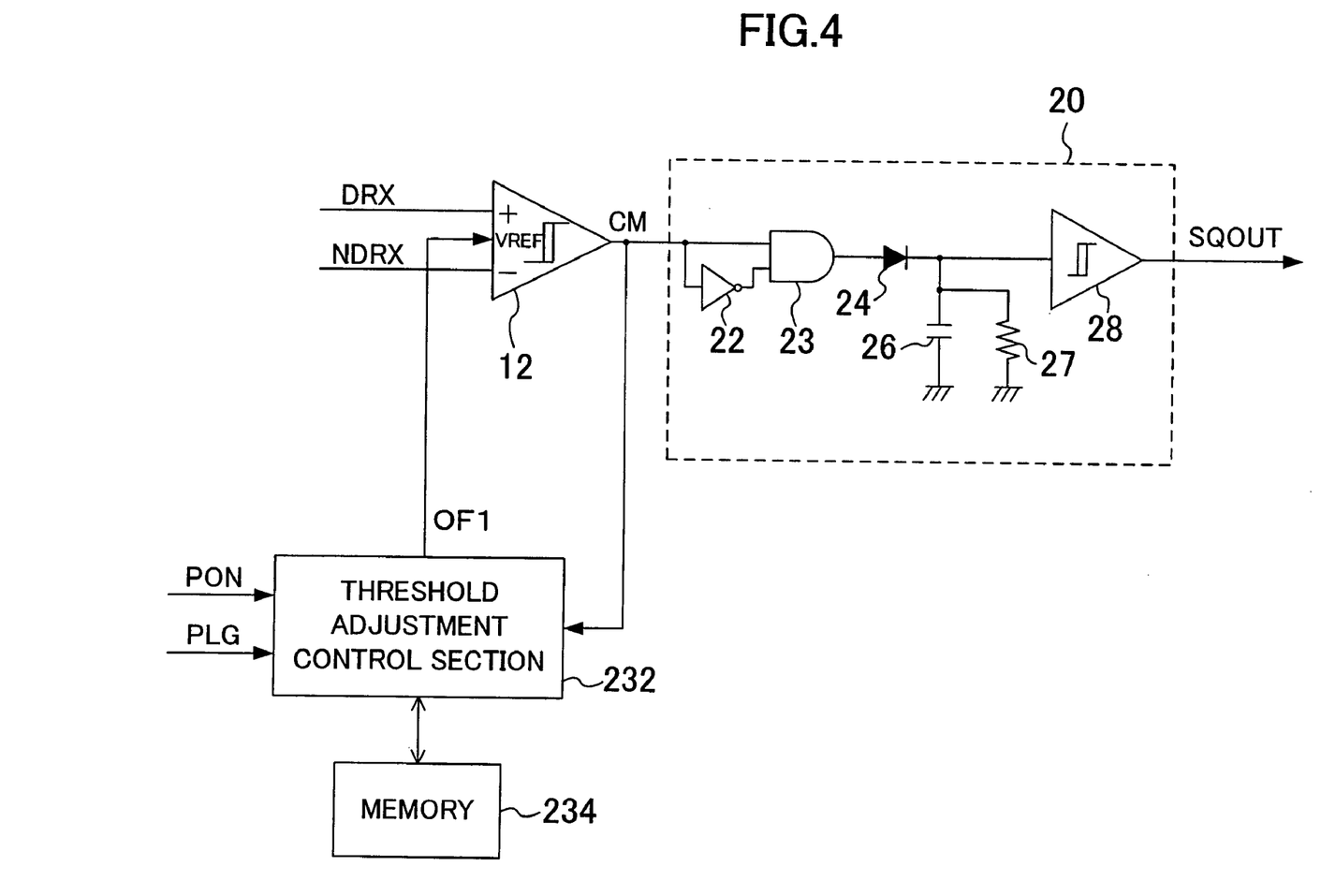
FIG. 4 is a block diagram of a signal detection circuit of the first alteration.

FIG. 4 is a block diagram of a signal detection circuit of the first alteration. The signal detection circuit of FIG. 4 includes a threshold adjustment control section 232 in place of the threshold adjustment control section 32 and further includes a memory 234 in addition to the components of the signal detection circuit of FIG. 1.

An initial value for the detection level adjustment signal OF1 is stored in the memory 234. The initial value may be a value appropriate as the detection level adjustment signal OF1, determined at the time of design of the signal detection circuit of FIG. 4, for example.

Figure 5A:
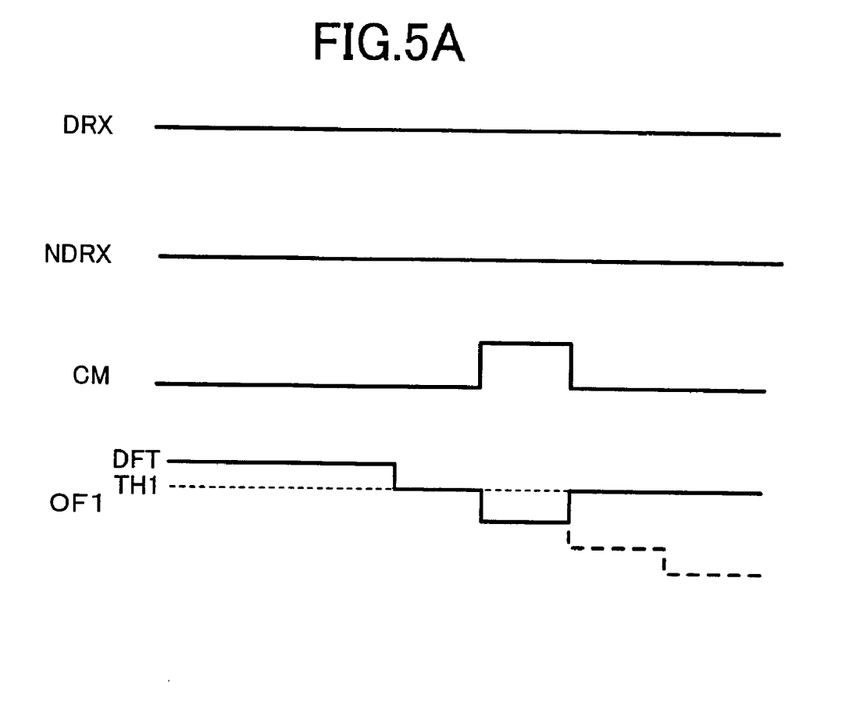
FIGS. 5A and 5B are timing charts showing examples of change of signals during adjustment of the threshold voltage of a comparator in the signal detection circuit of FIG. 4.
Figure 5B:
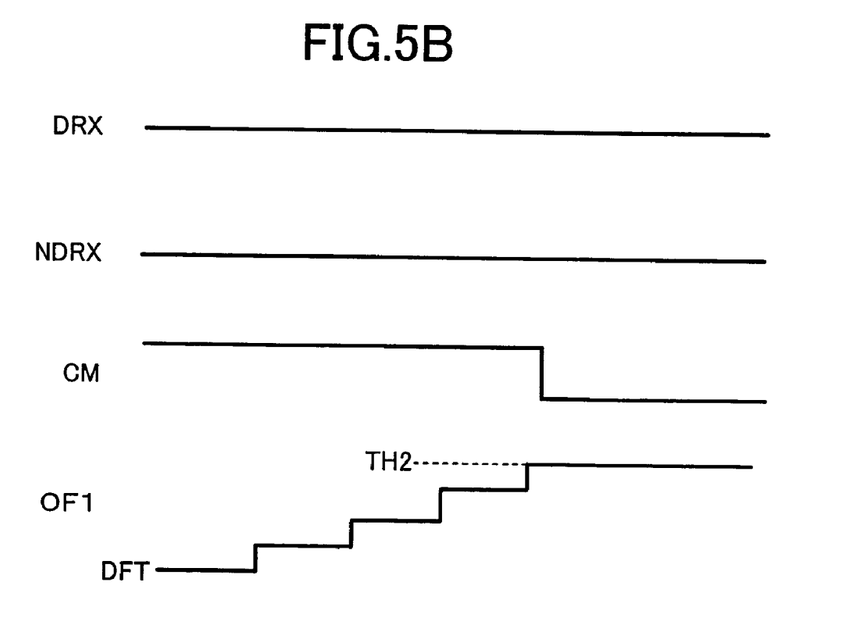

FIGS. 5A and 5B are timing charts showing examples of change of signals during the adjustment of the threshold voltage of the comparator 12 in the signal detection circuit of FIG. 4. During the time of non-signal input, the threshold adjustment control section 232 reads an initial value from the memory 234 to use the value as the initial value DFT of the detection level adjustment signal OF1. In this adjustment, when the detection signal CM is "L", the threshold adjustment control section 232 lowers the potential of the detection level adjustment signal OF1 as shown in FIG. 5A so as to decrease the threshold voltage of the comparator 12.

At the time when the detection signal CM goes "H", the threshold voltage of the comparator 12 has fallen a little excessively. Therefore, the threshold adjustment control section 232 raises the potential of the detection level adjustment signal OF1 back to an immediately preceding value TH1.

Alternatively, the threshold adjustment control section 232 may continuously lower the potential of the detection level adjustment signal OF1 within a predetermined range and then adjust the potential of the detection level adjustment signal OF1 to the appropriate value TH1.

When the detection signal CM is "H" at the setting of the initial value DFT for the detection level adjustment signal OF1, the threshold adjustment control section 232 raises the potential of the detection level adjustment signal OF1 as shown in FIG. 5B.

The detection signal CM goes "L" when the detection level adjustment signal OF1 reaches a potential TH2. The threshold adjustment control section 232 therefore fixes the detection level adjustment signal OF1 at the potential TH2.

As described above, in the signal detection circuit of FIG. 4, a value appropriate as the detection level adjustment signal OF1, determined at the time of design, is used as the initial value for the adjustment of the threshold voltage. Accordingly, the time required for the adjustment can be shortened.

(Second Alteration)

The threshold voltage of the comparator 12 may be adjusted as described above with reference to FIGS. 5A and 5B at the time of pre-shipment examination after fabrication of the signal detection circuit of FIG. 4, and the resultant value of the detection level adjustment signal OF1 may be written in the memory 234. At the time of actual use of the signal detection circuit, the threshold adjustment control section 232 uses the value read from the memory 234 as the value of the detection level adjustment signal OF1.

Otherwise, the value read from the memory 234 may be used as the initial value of the detection level adjustment signal OF1, to further adjust the threshold voltage of the comparator 12 as shown in FIGS. 5A and 5B.

(Third Alteration)

The detection signal CM may sometimes remain "H" or "L" despite of the adjustment of the threshold voltage of the comparator 12 as described with reference to FIGS. 5A and 5B at the time of pre-shipment examination after fabrication of the signal detection circuit of FIG. 4. In this case, such a signal detection circuit, which will be unable to detect a signal, should be regarded as a defective and be blocked from being shipped.

In view of the above, in the above case, the threshold adjustment control section 232 writes a specific value in the memory 234. The specific value may be the maximum or minimum value in an adjustment range of the detection level adjustment signal OF1, or a value outside the adjustment range.

After the examination, whether or not the signal detection circuit is a defective is clarified by reading the value written in the memory 234, and in this way, shipment of a defective can be blocked.

(Fourth Alteration)

Figure 6:
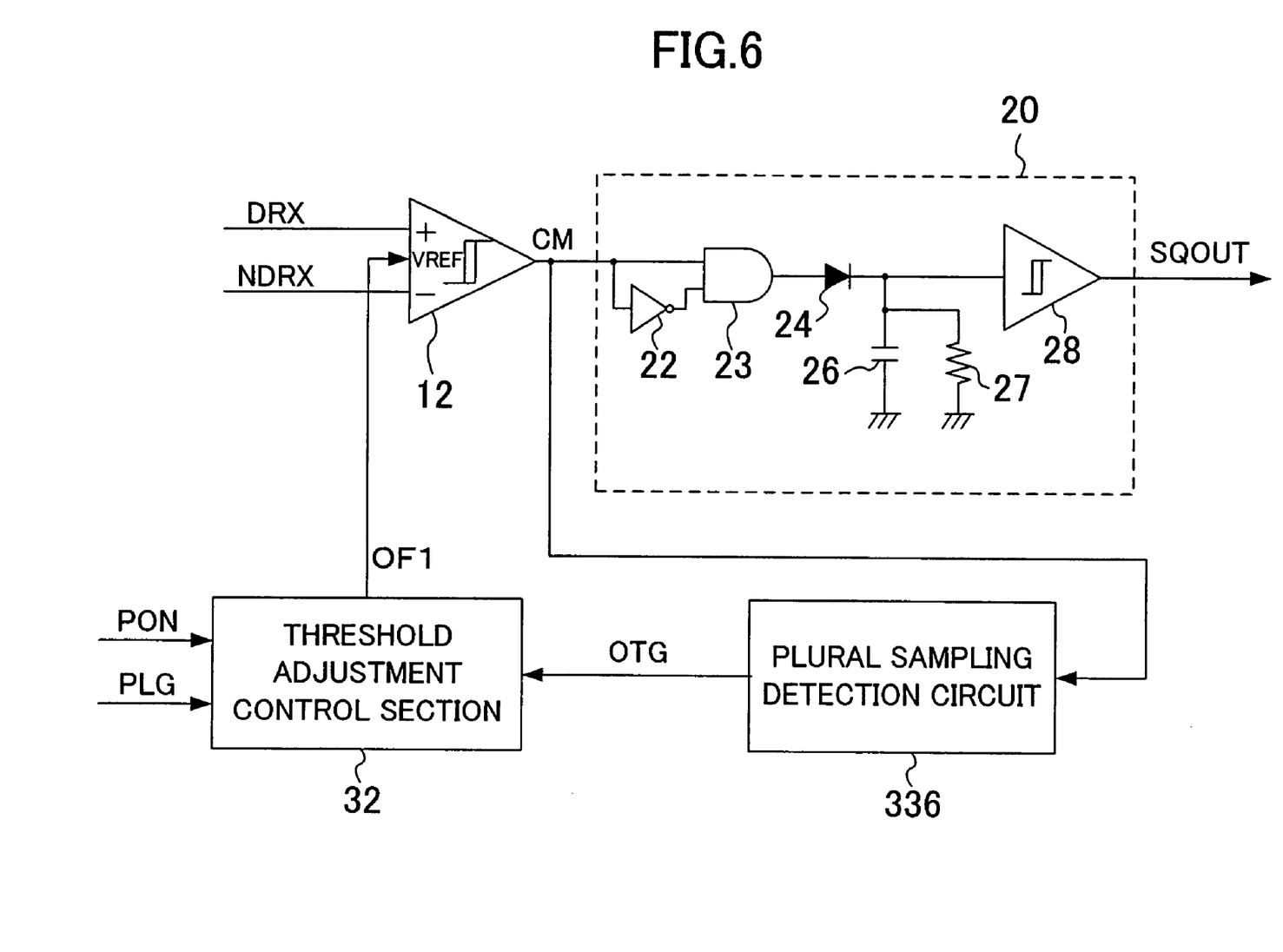
FIG. 6 is a block diagram of a signal detection circuit of the fourth alteration.

FIG. 6 is a block diagram of a signal detection circuit of the fourth alteration. The signal detection circuit of FIG. 6 includes a plural sampling detection circuit 336 in addition to the components of the signal detection circuit of FIG. 1.

The plural sampling detection circuit 336 repeats sampling of the detection signal CM, and determines whether or not the detection signal CM indicates that an input signal has been detected, every predetermined number of times of sampling. For example, if all sample values are "L", the plural sampling detection circuit 336 determines that a differential signal has not been detected and outputs "L" to the threshold adjustment control section 32 as a plural sampling detection signal OTG. If any one of sample values is "H", "H" is output.

In the signal detection circuit of FIG. 6, the reliability of the plural sampling detection signal OTG given to the threshold adjustment control section 32 can be enhanced. For example, even in the case that the detection signal CM repeats "H" and "L" alternately during the adjustment of the threshold voltage, correct adjustment of the threshold voltage can be attained.

The plural sampling detection circuit 336 may output "L" as the plural sampling detection signal OTG only when the sample value is consecutively "L" for a predetermined number of times.

Second Embodiment

Figure 7:
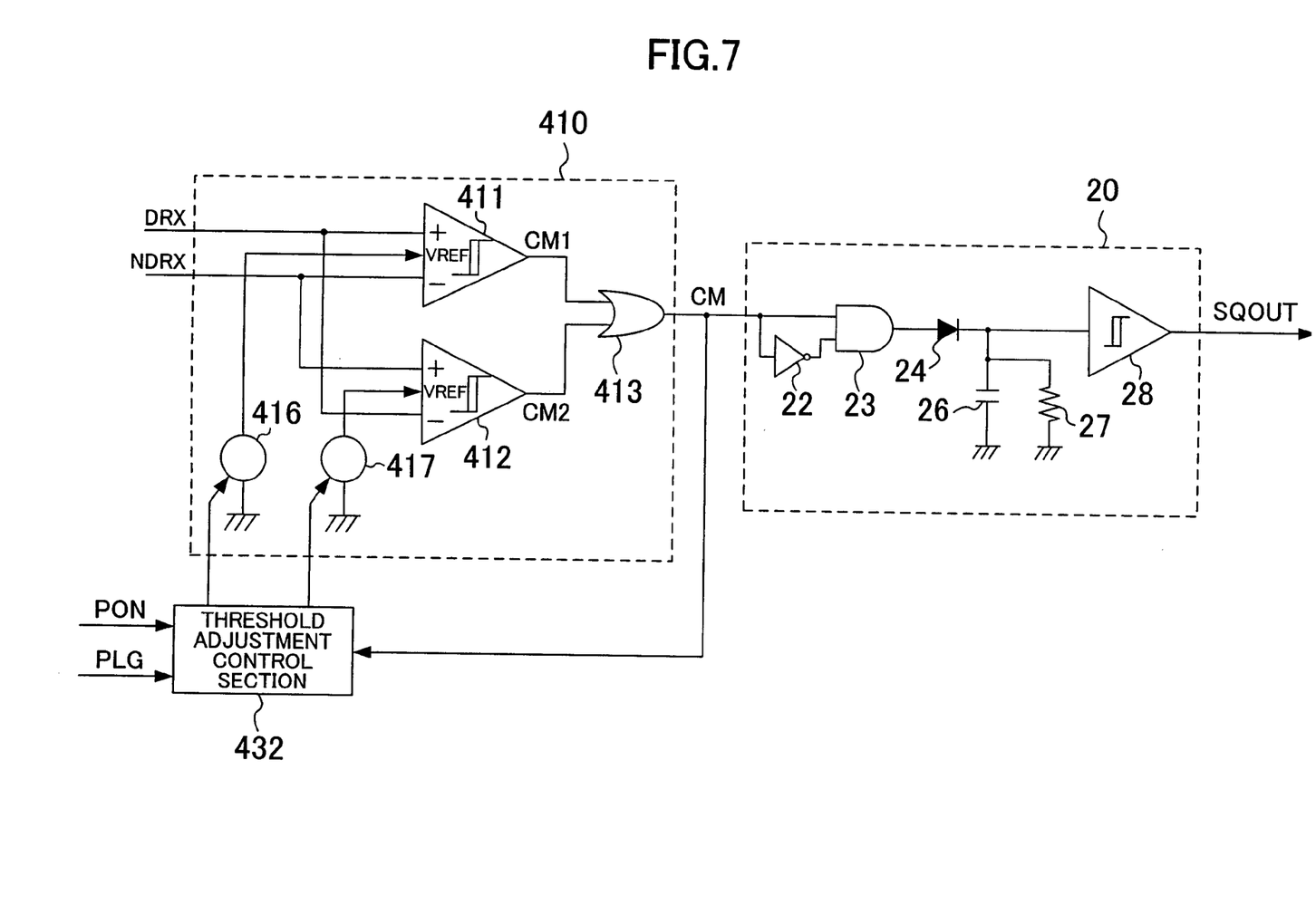
FIG. 7 is a block diagram of a signal detection circuit of the second embodiment of the present invention.

FIG 7 is a block diagram of a signal detection circuit of the second embodiment of the present invention. The signal detection circuit of FIG. 7 includes a comparison section 410, the detection section 20 and a threshold adjustment control section 432. The comparison section 410 includes comparators 411 and 412, an OR gate 413 and voltage generators 416 and 417. The detection section 20 is the same as that described above with reference to FIG. 1 and therefore description thereof is omitted here.

The threshold adjustment control section 432 generates detection level adjustment signals OF1 and OF2 in response to the detection signal CM and outputs the signals to the voltage generators 416 and 417, respectively. The voltage generator 416 generates a signal corresponding to the detection level adjustment signal OF1 and outputs the resultant signal to a reference input terminal of the comparator 411. The voltage generator 417 generates a signal corresponding to the detection level adjustment signal OF2 and outputs the resultant signal to a reference input terminal of the comparator 412.

The comparators 411 and 412 are substantially the same in configuration as the comparator 12 in FIG. 1. Input signals DRX and NDRX are input into positive and negative input terminals, respectively, of the comparator 411, while the input signals NDRX and DRX are input into positive and negative input terminals, respectively, of the comparator 412. The OR gate 413 calculates OR of a signal CM1 output from the comparator 411 and a signal CM2 output from the comparator 412, and outputs the result to the threshold adjustment control section 432 and the detection section 20 as the detection signal CM.

The threshold voltages of transistors in the two comparators 411 and 412 vary independently from each other.

Therefore, the threshold voltages of these comparators are made adjustable independently.

Once receiving the power-on signal PON or the hot plug signal PLG, the threshold adjustment control section 432 starts adjustment of the threshold voltages of the comparators 411 and 412. The threshold adjustment control section 432 determines the detection level adjustment signal OF1 and OF2 independently in the manner described in the first embodiment. Note however that in determination of the detection level adjustment signal OF1, the threshold voltage of the comparator 412 (the detection level adjustment signal OF2) should be made maximum, while in determination of the detection level adjustment signal OF2, the threshold voltage of the comparator 411 (the detection level adjustment signal OF1) should be made maximum.

Assuming that after determination of the detection level adjustment signals OF1 and OF2, the threshold voltages of the comparators 411 and 412 are both set at VR, the condition for the detection CM going "H" is $$|V(DRX)-V(NDRX)|>VR$$

where V(DRX) and V(NDRX) are the potentials of the input signals DRX and NDRX, respectively.

As described above, with the comparator 411 receiving a differential signal and the comparator 412 receiving a differential signal opposite in polarity to the input differential signal, the signal detection circuit of FIG. 7 can reliably detect that the voltage of the differential signal exceeds the threshold voltage, and thus can improve the reliability in the detection of the squelch signal SQOUT.

According to the signal detection circuits of the embodiments described above, the threshold voltages of the comparators 12, 411 and 412 can be adjusted to appropriate values. This makes it possible to prevent detection of noise as an input signal or failure in detection of a signal to be detected. Also, detection of an input signal can be made available even in the case that the detection signal CM is "H" during the non-signal time period.

The invention claimed is:

1. A signal detection circuit comprising:
   a comparison section for comparing the absolute value of a voltage of an input differential signal with a threshold voltage corresponding to a first detection level adjustment signal to detect presence/absence of an input signal and outputting a detection signal indicating the detection result;
   a threshold adjustment control section for generating the first detection level adjustment signal in response to the detection signal and outputting the generated signal; and
   a detection section for detecting whether or not the level of the detection signal changes repeatedly,
   wherein, during the time of no input of the differential signal, the threshold adjustment control section changes the first detection level adjustment signal so that the threshold voltage monotonically increases or decreases until the detection signal is inverted, to determine the first detection level adjustment signal that makes the threshold voltage appropriate, and outputs the determined signal.

2. The signal detection circuit of claim 1, wherein the threshold adjustment control section changes the first detection level adjustment signal so that the threshold voltage increases when the detection signal indicates that the input signal has been detected.

3. The signal detection circuit of claim 1, wherein the threshold adjustment control section changes the first detection level adjustment signal so that the threshold voltage decreases when the detection signal indicates that the input signal has not been detected, and once the detection signal is inverted, outputs the first detection level adjustment signal obtained immediately before the inversion.

4. The signal detection circuit of claim 1, further comprising a memory,
   wherein the threshold adjustment control section reads a value stored in the memory and determines the first detection level adjustment signal using the read value.

5. The signal detection circuit of claim 4, wherein the threshold adjustment control section uses the value read from the memory as an initial value for changing the first detection level adjustment signal.

6. The signal detection circuit of claim 4, wherein the threshold adjustment control section determines the first detection level adjustment signal that makes the threshold voltage appropriate and stores the determined value in the memory, and thereafter reads the stored value from the memory to be output to the comparator as the first detection level adjustment signal.

7. The signal detection circuit of claim 1, further comprising a plural sampling detection circuit for sampling the detection signal a plurality of times to determine whether or not the detection signal indicates that the input signal has been detected and outputting the determination result to the threshold adjustment control section.

8. The signal detection circuit of claim 1, wherein the threshold adjustment control section further generates a second detection level adjustment signal in response to the detection signal,
   the comparison section comprises:
   a first comparator for detecting whether or not the absolute value of a voltage of the input differential signal is equal to or more than a threshold voltage corresponding to the first detection level adjustment signal and outputting a first comparison result signal indicating the detection result;
   a second comparator for receiving a differential signal opposite in polarity to the input differential signal, detecting whether or not the absolute value of the voltage of the received signal is equal to or more than a threshold voltage corresponding to the second detection level adjustment signal and outputting a second comparison result signal indicating the detection result; and
   an OR gate for calculating OR of the first comparison result signal and the second comparison result signal and outputting the calculation result as the detection signal.

9. The signal detection circuit of claim 1, wherein the threshold adjustment control section determines the first detection level adjustment signal that makes the threshold voltage appropriate once the signal detection circuit is powered on.

10. The signal detection circuit of claim 1, wherein the threshold adjustment control section determines the first detection level adjustment signal that makes the threshold voltage appropriate once a cable for transmitting the differential signal is connected.

* * * * *